(12) United States Patent
Dyson et al.

(10) Patent No.: US 8,372,723 B2
(45) Date of Patent: Feb. 12, 2013

(54) BIPOLAR DEVICE HAVING BURIED CONTACTS

(75) Inventors: Mark Dyson, Singapore (SG); Daniel C. Kerr, Oak Ridge, NC (US); Nace M. Rossi, Singapore (SG)

(73) Assignee: Agere Systems LLC, Wilmington, DE (US)

( * ) Notice: Subject to any disclaimer, the term of this patent is extended or adjusted under 35 U.S.C. 154(b) by 0 days.

(21) Appl. No.: 13/222,877

(22) Filed: Aug. 31, 2011

(65) Prior Publication Data

US 2011/0312146 A1 Dec. 22, 2011

Related U.S. Application Data

(62) Division of application No. 11/533,785, filed on Sep. 21, 2006, now Pat. No. 8,049,282.

(51) Int. Cl.
*H01L 21/331* (2006.01)
(52) U.S. Cl. .................................................. 438/309
(58) Field of Classification Search ................... 438/309
See application file for complete search history.

(56) References Cited

U.S. PATENT DOCUMENTS

| | | | |
|---|---|---|---|
| 4,902,639 A | 2/1990 | Ford | |
| 5,358,884 A | 10/1994 | Violette | |
| 5,547,893 A | 8/1996 | Sung | |
| 6,066,520 A | 5/2000 | Suzuki | |
| 6,232,638 B1 | 5/2001 | Suzuki | |
| 6,265,747 B1 | 7/2001 | Suzuki | |
| 6,476,452 B2 | 11/2002 | Suzuki | |
| 6,667,202 B2 * | 12/2003 | Suzuki | 438/202 |
| 6,703,685 B2 | 3/2004 | Ahmed et al. | |
| 6,806,159 B2 | 10/2004 | Pinto et al. | |
| 6,943,428 B2 | 9/2005 | Furukawa et al. | |
| 7,015,085 B2 | 3/2006 | Ahmed et al. | |
| 7,164,186 B2 | 1/2007 | Pinto et al. | |
| 7,414,298 B2 | 8/2008 | Ahmed et al. | |
| 2002/0011648 A1 | 1/2002 | Suzuki | |
| 2002/0130370 A1 | 9/2002 | Suzuki | |
| 2003/0062598 A1 | 4/2003 | Pinto et al. | |
| 2003/0107106 A1 | 6/2003 | Ahmed et al. | |
| 2003/0160301 A1 | 8/2003 | Furukawa et al. | |
| 2004/0021202 A1 | 2/2004 | Ahmed et al. | |
| 2004/0021206 A1 | 2/2004 | Ahmed et al. | |
| 2005/0037588 A1 | 2/2005 | Pinto | |
| 2005/0073009 A1 | 4/2005 | Kojima et al. | |
| 2008/0076228 A1 | 3/2008 | Dyson et al. | |

* cited by examiner

*Primary Examiner* — Bradley K Smith

(57) ABSTRACT

This disclosure, in one aspect, provides a method of manufacturing a semiconductor device that includes forming a collector for a bipolar transistor within a semiconductor substrate, forming a base within the collector, forming a patterned isolation layer over the collector and base, forming an emitter layer over the patterned isolation layer, forming an isolation layer over the emitter layer, patterning the patterned isolation layer, the emitter layer and the isolation layer to form at least one emitter structure having an isolation region located on a sidewall thereof, and forming a buried contact in the collector to a depth sufficient to adequately contact the collector.

10 Claims, 10 Drawing Sheets

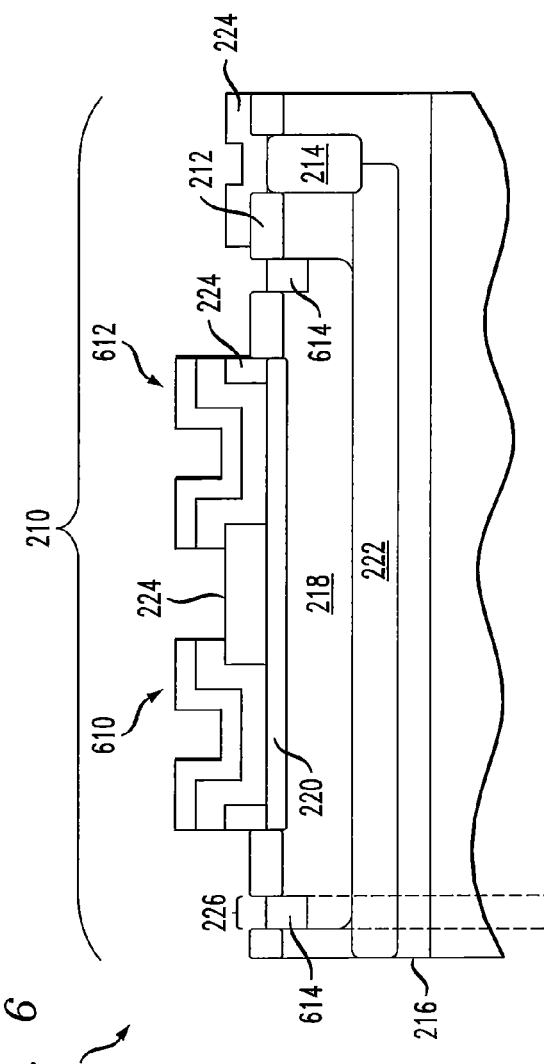

BIPOLAR DEVICE HAVING BURIED CONTACTS

CROSS-REFERENCE TO RELATED APPLICATIONS

This Application is a Divisional of U.S. application Ser. No. 11/533,785 filed on Sep. 21, 2006 now U.S. Pat. No. 8,049,282, to Mark Dyson et al., entitled "BIPOLAR DEVICE HAVING BURIED CONTACTS," currently allowed; commonly assigned with the present invention and incorporated herein by reference.

TECHNICAL FIELD

This disclosure is directed, in general, to a semiconductor device and a method of manufacturing that device and, more specifically, to an improved bipolar device having buried contacts.

BACKGROUND

Miniaturization of semiconductor devices continues to be an important goal for the semiconductor industry. However, semiconductor devices, e.g., bipolar transistors, present ongoing challenges to semiconductor manufacturers in achieving this miniaturization while meeting increased component densification objectives. As devices continue to shrink, there is also a concurrent need for increased component densification. Achieving both of these objectives is not always straight forward in that each objective often requires implementing complex solutions or processes that affect the other.

For example, vertical PNP (VPNP) bipolar transistors typically include a sinker region, e.g., a PTUB (a p-type doped tub) located adjacent the collector. The PTUB design rules are typically large (e.g., 1.6 microns). Consequently, the collector-base breakdown can be limited by the PTUB to base contact space. Thus, in those designs where an optimum emitter base breakdown voltage (Bvcbo) is desired, a relatively large distance needs to separate the PTUB and the base contact. These large design requirements cause the device to take up excessive space on the chip. Further, VPNP devices often include n-isolation regions located under the collector. Since the n-isolation junction has to isolate the PNP collector from the p-substrate, the large sizes associated with this structure and its isolation scheme increases the collector-substrate capacitance.

To combat this, the industry could use a special purpose p-sinker mask and implant that has tighter design rules. However this is not suitable for all applications because of the extra processing costs associated with this solution. Thus, this particular solution is applicable in only a limited number of designs.

Alternatively, a deep trench isolation process on thick silicon-on-insulator (SOI) wafers can be used to isolate the collector from the p-substrate and sharply reduce the collector-substrate capacitance. However, the deep trench process is fairly expensive in that it includes at least one extra mask, two extra etches, a deposition, and a chemical/mechanical planarization step. Moreover, this option still requires the p-sinker mask and implant (which may be a PTUB). The PTUB size and space to base contact still limits the PNP size.

Accordingly, there is a need to provide a process and device by which the overall size of a VPNP bipolar transistor can be reduced without significant productions costs, production time or an increase in capacitance.

SUMMARY

To address the above-discussed deficiencies, this disclosure provides, in one embodiment, a method of manufacturing a semiconductor device. In this embodiment, the method includes forming a collector for a bipolar transistor within a semiconductor substrate, forming a base within the collector, forming a patterned isolation layer over the collector and base, forming an emitter layer over the patterned isolation layer, forming an isolation layer over the emitter layer, patterning the patterned isolation layer, the emitter layer and the isolation layer to form at least one emitter structure having an isolation region located on a sidewall thereof, and forming a buried contact in the collector to a depth sufficient to adequately contact the collector.

In another embodiment, this disclosure provides another method of manufacturing a semiconductor device. In this embodiment, the method comprises forming a collector for a bipolar transistor within a semiconductor substrate, forming a base within the collector, forming an emitter layer over the patterned isolation layer, forming an isolation layer over the emitter layer, patterning the emitter layer and the isolation layer to form at least one emitter structure having an isolation region located on a sidewall thereof, and forming a diffusion buried contact region, at least a portion of which is located in a trench that extends into the collector to a depth sufficient to adequately contact the collector and that makes electrical connection within the collector, wherein the diffusion buried contact region extends along the bottom and sidewalls of the trench, wherein the buried contact is formed subsequent to patterning the emitter layer, and the isolation layer.

The foregoing has outlined several embodiments of this disclosure so that those skilled in the art may better understand the detailed description of this disclosure that follows. Additional embodiments and features of this disclosure are described hereinafter, and the scope of this disclosure is not limited by the specific embodiments described herein. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of this disclosure.

BRIEF DESCRIPTION OF THE DRAWINGS

For a more complete understanding of the present invention, reference is now made to the following descriptions taken in conjunction with the accompanying drawings, in which:

FIGS. 2-6 illustrate views of one embodiment of a semiconductor device during various stages of fabrication wherein the buried contacts are formed;

FIG. 7 is a conventional device that is compared to FIG. 6 to show how space may be saved by implementing one embodiment of this disclosure;

DETAILED DESCRIPTION

Figure 1:
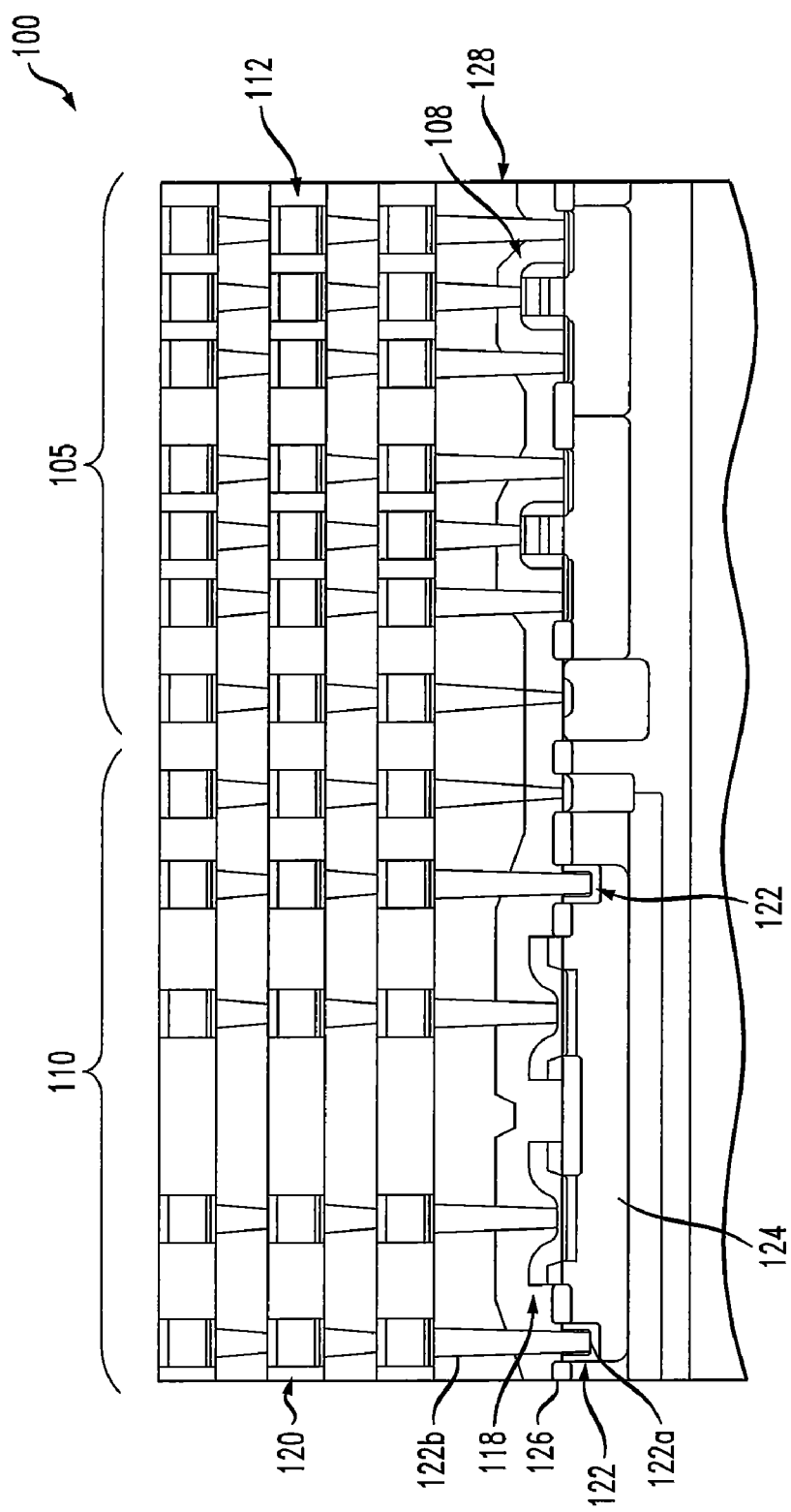
FIG. 1 illustrates a semiconductor device as provided by one embodiment of this disclosure.

Referring initially to FIG. 1, there is illustrated a general, partial view of a semiconductor device 100 as provided by this disclosure. In this embodiment, the semiconductor device 100 is configured as an integrated circuit and includes a transistor region 105 including non-bipolar transistors 108 (e.g., gate electrodes or other devices that are not configured as bipolar devices, e.g., PMOS or NMOS transistors), and interconnects 112. The transistor region 105 may be of conventional design and manufactured with conventional processes and materials known to those skilled in the art. In the illustrated embodiment, the transistors 108 are configured as a complementary CMOS device. For purposes of discussion, it should be noted that the drawings discussed herein are not to scale and are given for illustrative purposes only.

The semiconductor device 100 further includes a bipolar transistor region 110. The region 110 includes bipolar transistors 118, e.g., vertical PNP bipolar transistors, as provided by this disclosure, and interconnects 120 that, in one embodiment, may be fabricated using conventional processes and materials. It should be noted that while separately designated for purposes of pointing to different areas of the device 100, interconnects 112 and 120 can be fabricated simultaneously and with the same deposition processes and materials. In addition, however, and unlike conventional devices, the bipolar transistor 118 further includes one or more buried contacts 122. The buried contacts 122 are located within a collector 124 of the bipolar transistor 118. As used herein, a buried contact 122 is a contact that makes electrical connection within the collector 124 and wherein at least a portion 122a of the contact is located within the collector 124. This definition also includes a buried contact that is located through a material layer formed from a substrate, e.g., an oxide layer 126, and a portion of which is located within the collector 124. The buried contact 122 may further include the contact plug portion 122b that extends through a pre-metal dielectric layer 128 that is located over the bipolar transistor 118.

Notably, collector tubs normally associated with conventional structures are not present in this embodiment. As used herein, a collector tub is a well tub that is located adjacent the collector that provides electrical connection to the collector. This includes conventional "sinker" tubs that are used to link between a P+ junction, which serves as a point of contact for a contact plug, and the peak concentration region of the collector. In advantageous embodiments of this disclosure, the collector tub is not present, however as explained in alternative embodiments the collector tub may be present.

In such embodiments, this disclosure recognizes a space-saving advantage by eliminating collector tubs and using the buried contacts 122 in place of the collector tubs to make electrical contact with the collector 124. The collector tubs normally require a substantial amount of space to make contact with the collector. Replacing these collector tubs with much smaller buried contacts, realizes additional space across the wafer.

In other embodiments of this disclosure, a collector tub may be present. However, because of the presence of the buried contact, the tubs may be configured with much smaller dimensions than those found conventional devices, which in turn also provide additional component space. However this is not suitable for all applications because of the extra processing costs associated with his solution. Thus, this particular solution is applicable in only a limited number of designs and other embodiments provide greater processing flexibility. The added wafer space afforded by this disclosure allows the construction of more devices on the wafer, and thereby, provides greater component density. Moreover, because the methods discussed herein are relatively simple from a processing standpoint and easily integrated into standard process flows, the stated advantages can be achieved without significant additional processing steps or cost.

Figure 2:
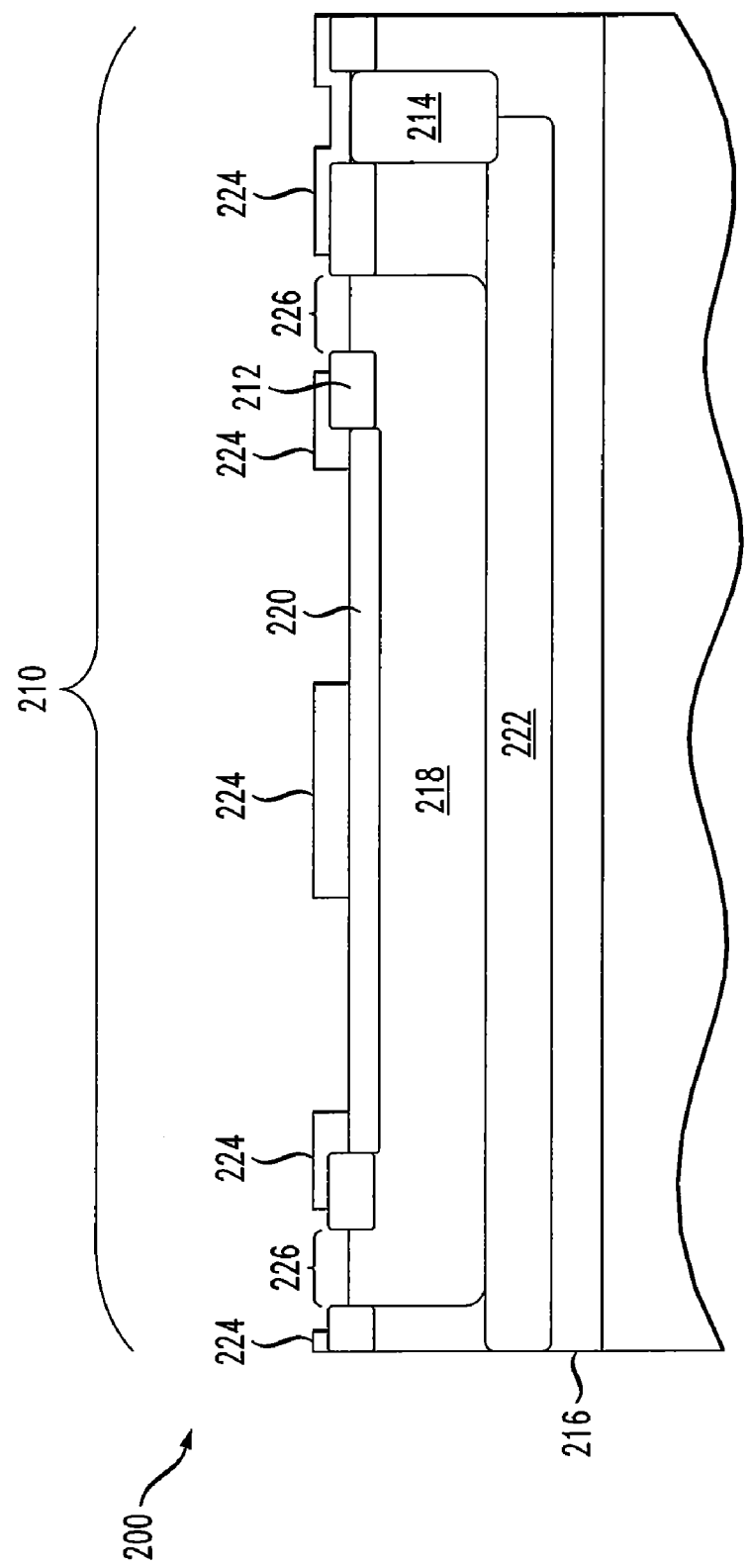

FIG. 2 illustrates a partial view of one embodiment of a semiconductor device 200 provided by this disclosure and at an early stage of manufacture. For purposes of discussion herein, this disclosure may employ many conventional deposition processes and materials. Thus, unless otherwise stated, assume that conventional process or materials may be used to form the stated features or features. In this view, a bipolar transistor region 210 is illustrated; the previously mentioned non-bipolar transistor region, which may also be present, is not shown here for brevity. However, several steps in constructing the non-bipolar transistors may have occurred at this point. For instance, isolation structures 212 (only one of which is designated), as those shown in the bipolar region 210, may have been formed at this point, along with NMOS and PMOS tub implants. During the formation of the NMOS and PMOS tub implants, N-doped tubs 214 may also be formed in the bipolar region 210. It should be noted that in describing certain embodiments of this disclosure, particular dopant schemes may be discussed. However, these dopant schemes are examples only, and other schemes may be used in other embodiments of this disclosure. The region 210, as well as the non-bipolar region when present, is located over a semiconductor substrate 216, e.g., a conventional epitaxial (epi) layer or a doped region of a semiconductor wafer. The wafer or epitaxial layer may be any number of semiconductor substrate types, e.g., doped silicon, silicon germanium, gallium arsenide, or indium.

In the illustrated embodiment, a collector 218, a base 220, and an isolation region 222 are located within the substrate 216. A patterned oxide layer 224 exposes the base 220 and the buried contact openings 226 of the collector 218. In later steps, the buried contact openings 226 are used to form buried contacts. The oxide layer 224 may be present in certain embodiments because of the deposition of a spacer oxide layer for the non-bipolar transistor devices. Conventional lithographic processes may be used to pattern the oxide layer 224. During an etch of the oxide layer 224, the oxide layer 224 is etched to create the buried contact openings 226 in the oxide layer 224 located over the collector 218. In the embodiment shown in FIG. 2, the buried contact openings 226 are located where collector tubs are normally located. However, as mentioned above, this does not preclude the inclusion of collector tubs in all embodiments.

As mentioned above, the collector tubs, which are normally contacted near the surface of the substrate 216 provide electrical connection to the collector 218. Typically, collector tub design rules are relatively large, for example around 1.6 microns in width, to provide adequate breakdown voltages between the base contact and the collector tub. However, because the buried contacts are narrower than conventional collector tubs, they may be used in place of the collector tubs or in conjunction with much smaller dimensioned tubs; the smaller openings save space across the wafer allowing for device densification. In another embodiment, which is described in more detail below, the openings 226 may be formed within a field oxide region 212 located adjacent the collector 218.

Figure 3:
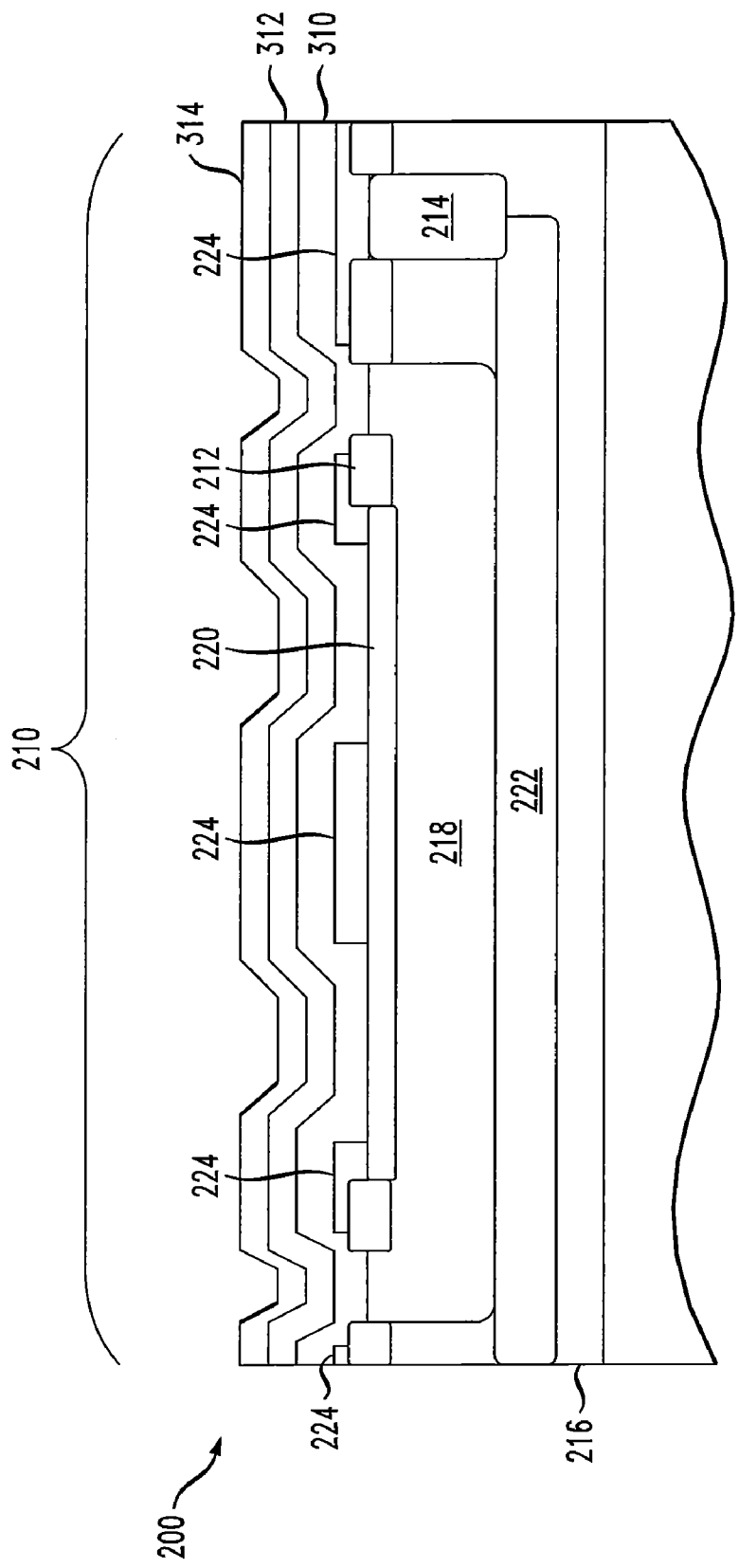

Following the formation of the openings 226 in the oxide layer 224, a deposition process deposits an emitter layer 310, e.g., a polysilicon layer, over the oxide layer 224 and within the openings 226, as shown in FIG. 3. The emitter layer 310 may be a single layer, e.g., a polysilicon layer, in the case where the bipolar transistor is a PNP device, or it may comprise more than one material layer, in the case where the bipolar transistor is an NPN device. Often, PNP and NPN complementary devices exist in the same semiconductor device. In such instances, deposition processes sequentially deposit a nitride layer 312 and an oxide layer 314 over the emitter layer 310 for both the PNP and the NPN bipolar transistors, as shown in FIG. 3.

Figure 4:
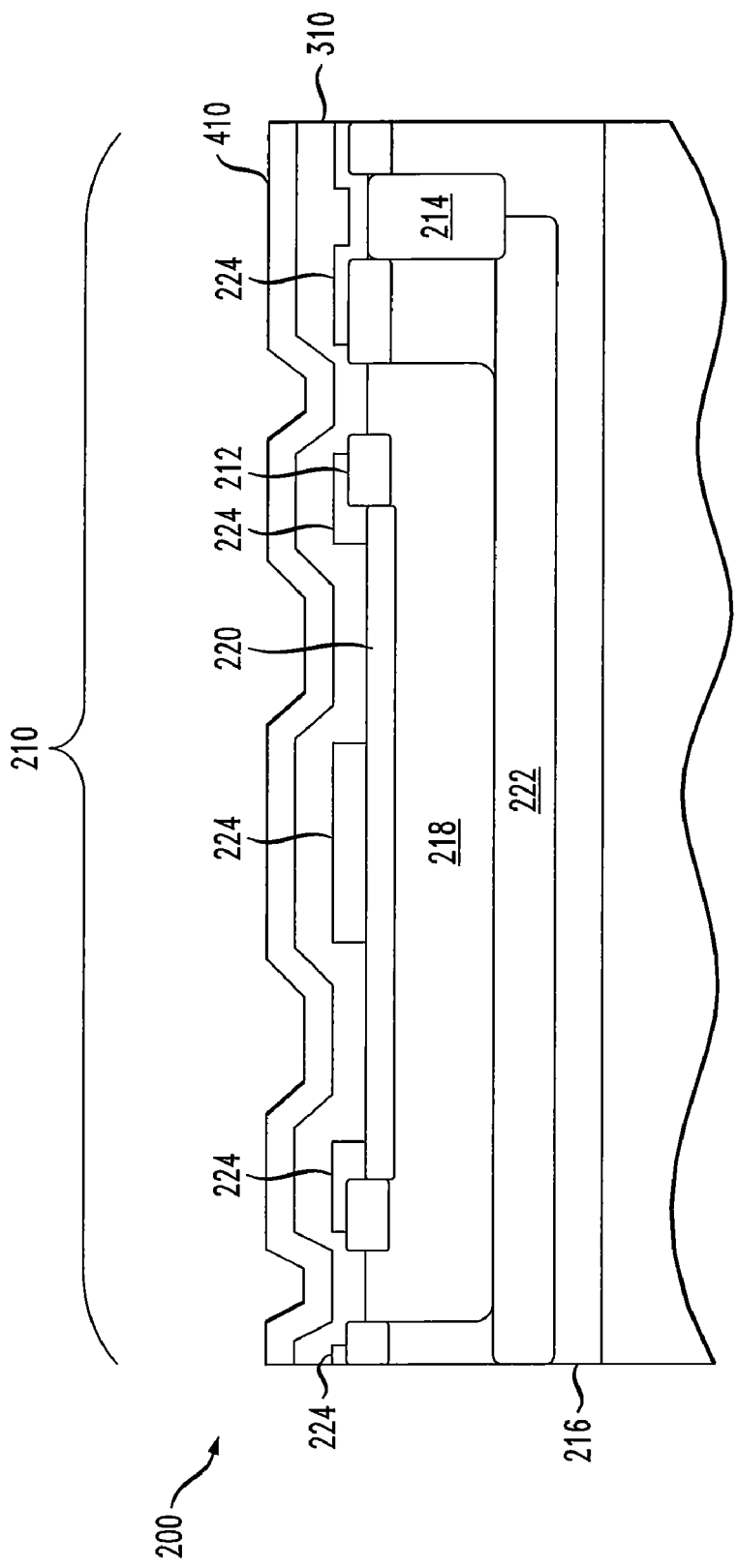

In the PNP device, the nitride layer 312 and the oxide layer 314 are removed, and a second oxide deposition, which may be a conventional process, deposits an oxide layer 410 over the emitter layer 310, as illustrated in FIG. 4. The oxide layer 410 provides additional protection during subsequent process steps. In the illustrated embodiment, the semiconductor device 200 is a PNP bipolar transistor. However, as mentioned above, this disclosure is also useful in both NPN and PNP bipolar transistor devices. As mentioned above, two layers of polysilicon may be used to form the emitters, P+ doped for NPN base poly and PNP emitter poly, and N+ doped for the NPN emitter poly. Often two masking steps are used to pattern these poly layers. In addition, the process may also have two emitter window patterning steps, e.g., an NPN emitter window mask that etches an oxide layer, a nitride layer, and P+ poly, and a PNP emitter window mask that etches spacer oxides for non-bipolar transistors.

Using the above mask layers, together with field oxide patterns and implant layers, provides a wealth of buried contact combinations. As later described, a trench may be etched using a certain physical layer on the wafer. For example, by using the PNP emitter window mask to remove the spacer oxide layer, the poly layer etch will not stop on that oxide and will etch into the substrate 216. This forms but one type of buried contact.

Figure 5:
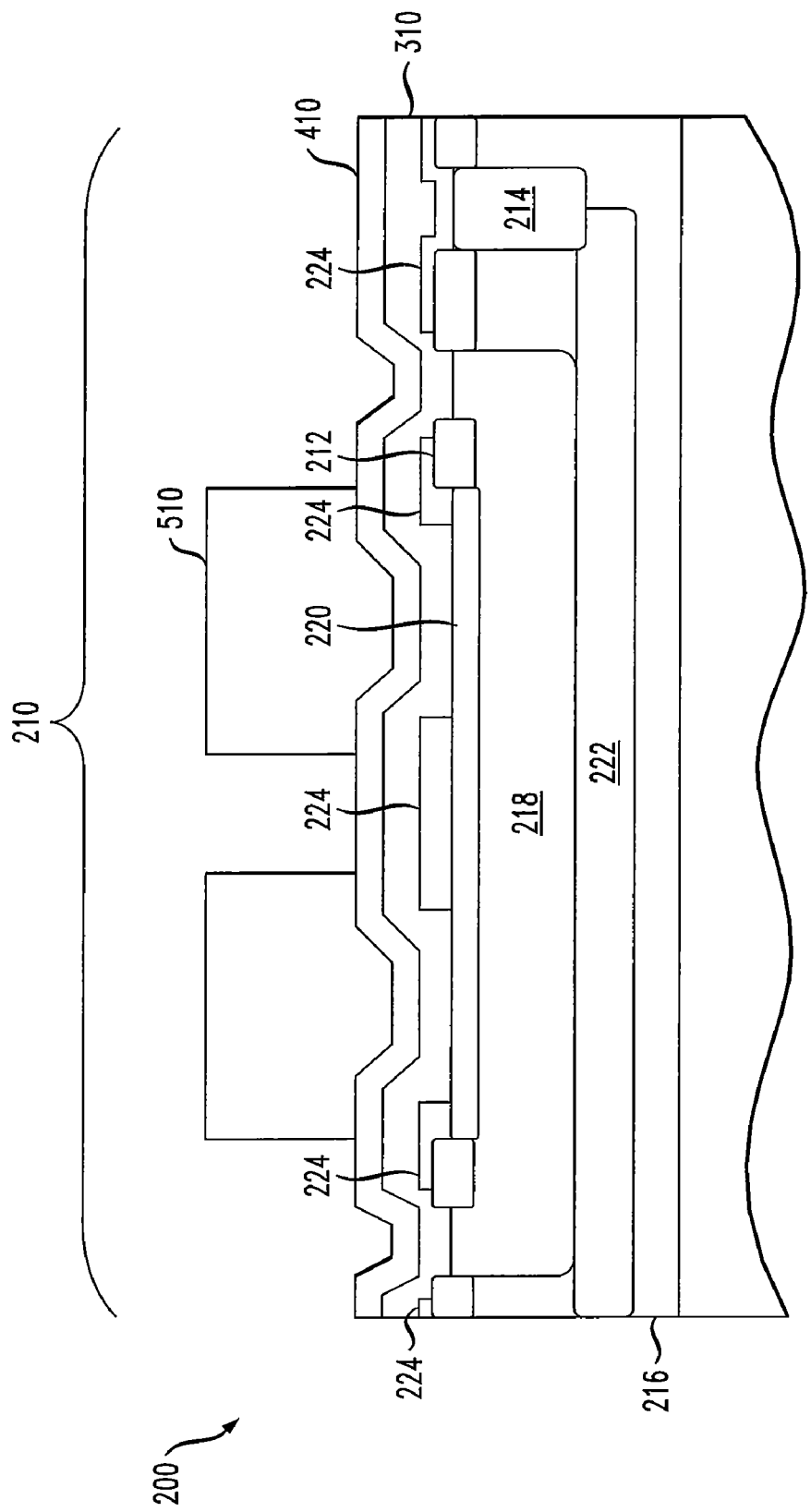

In FIG. 5, emitter regions are protected by patterned photoresist 510, as shown, and in FIG. 6, an oxide etch removes the unprotected oxide layer 410. The oxide etch is followed by an emitter etch that etches the unprotected emitter layer 310 and forms emitters 610 and 612. The emitter etch is selective to oxide, and normally there is a space oxide under it. In the area where the buried contacts are formed, the spacer oxide is removed by a previous etch. Therefore the emitter etch process does not stop at the buried contact opening 226 because the oxide layer 224 was previously removed as discussed above. Thus, the etch continues to etch into the underlying substrate 216. The emitter etch process is designed to remove the thickness of the emitter layer that overlies the non-bipolar transistor gate stack, so the overetch can be significant, for example 200% of the original emitter layer thickness. Thus, the etch forms trenches 614 in the collector 218 on adjacent sides of the emitters 610 and 612, but the other areas of the semiconductor device 200 are protected either by the photoresist 510 or the oxide layer 224. The etch is conducted deep enough to adequately contact the collector and provide the necessary degree of electrical connection for proper device function. This depth will vary, depending on the depth of the collector and its dopant profile, and those who are skilled in the art would be able to determine the depth required to make proper electrical connection. By way of example only, in one embodiment, the trench depth may be at least about 0.050 microns, however, in other embodiments, the trench depth may be about 1 micron. In yet other embodiments, the trench depth may extend to the peak concentration of the collector (that region where the average dopant concentration is greatest), which may also vary. In one embodiment the peak concentration depth may range from about 0.4 microns to as deep as 0.9 microns.

FIG. 7, which is a conventional bipolar device, is shown with FIG. 6 to simply illustrate the space savings that can occur in the embodiment of FIG. 6. As seen in this comparative illustration, FIG. 6 excludes the collector tub, but FIG. 7 includes the collector tub 710. In place of the collector tub 710, the embodiment of FIG. 6 uses the narrower trenches 614 to form the buried contacts. The use of the narrower trenches 614 achieves a significant amount of space savings on each side of the emitters 610 and 612, as represented by the dashed lines. In other embodiments, using a much narrower collector tub in conjunction with the buried contact as provided by this disclosure also achieves some space savings. However, for the reasons stated above, the embodiment of FIG. 6 is more flexible and cost effective.

Figure 8:
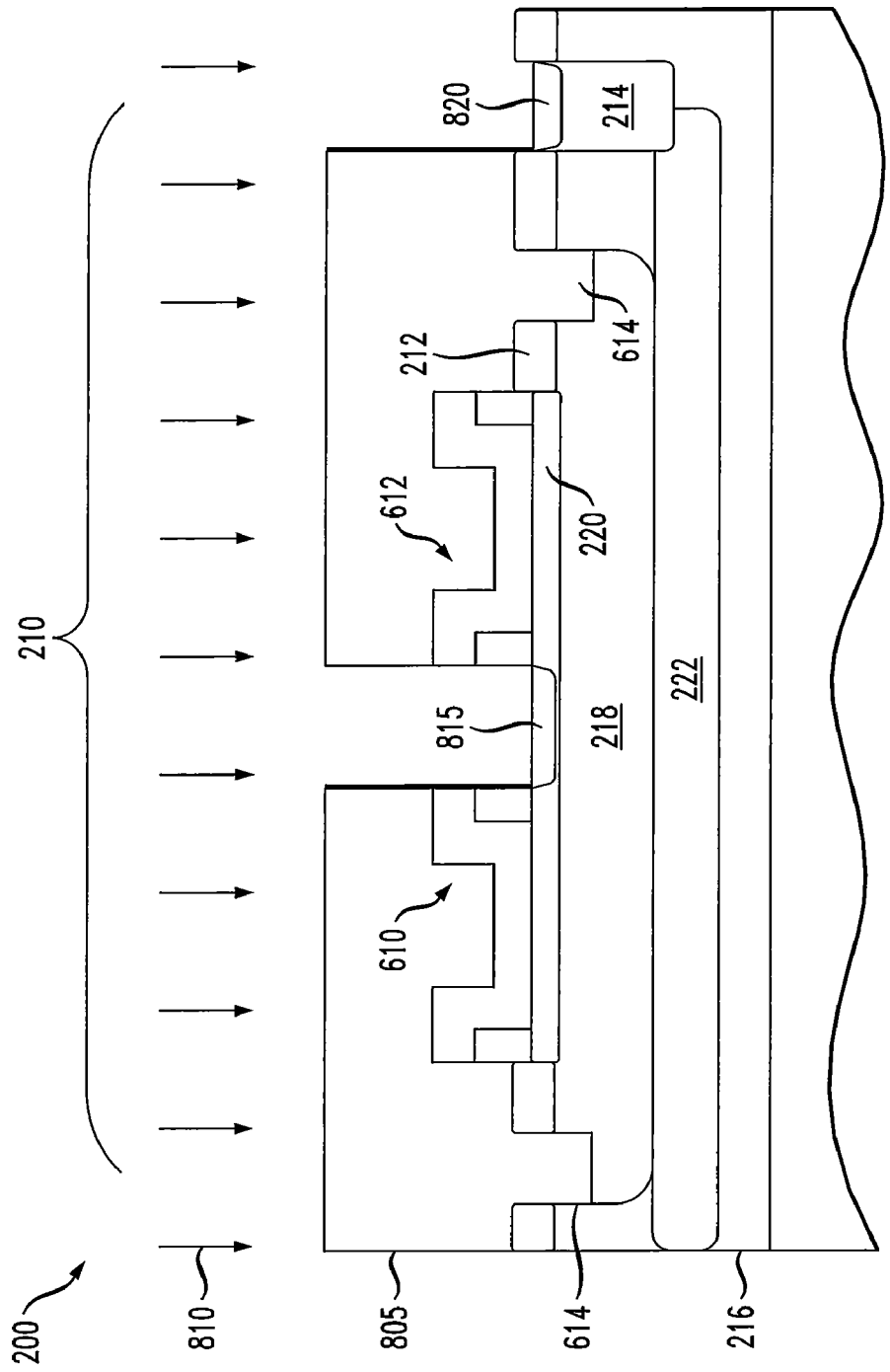
FIGS. 8-10 illustrate other steps during various stages of fabrication through the contact plug formation.

In FIG. 8, an etch process removes remaining portions of oxide layer 224, which exposes the contact regions for the base 220 and the N-tub 214. A photoresist layer 805 is deposited and patterned to expose the contact region for the base 220 and the N-tub 214, and an implant 810 is then conducted to form the contacts 815 and 820 for these structures, respectively.

Figure 9:
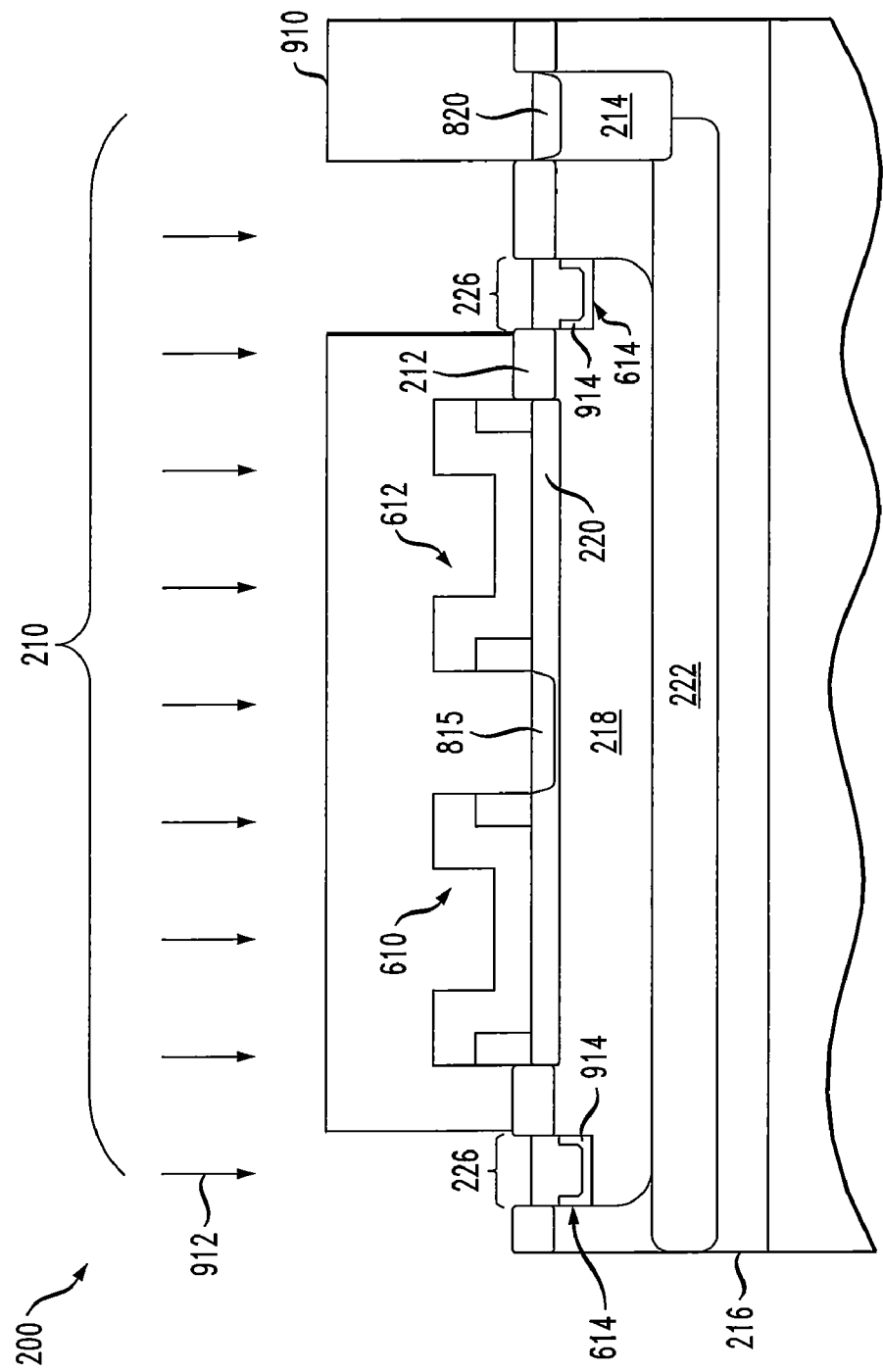

In FIG. 9, the photoresist layer 805 is removed and another photoresist layer 910 is deposited and patterned to expose the trenches 614. An implant 912 forms a junction contact 914 in the bottom of the trenches 614. In one embodiment, the junction contact 914 is implanted at the same time as a source/drain implant is conducted that forms source/drains in the non-bipolar transistors. The type of dopant that is implanted depends on whether the semiconductor device 200 is a PNP or and NPN. In the illustrated embodiment, a P+ junction may be formed in the bottom of the trenches 614 using a dopant dosage that ranges from about 5E14 atoms/cm$^3$ to about 1E16 atoms/cm$^2$. Conventional implantation processes may be used to form the junction contacts 914. However, the junction contacts 914 should have a dopant concentration and profile that is sufficient to overlap and provide electrical contact with the collector 218. Together, the trenches 614 and the junction contacts 914 form at least a portion of the buried contact structure.

Figure 10:
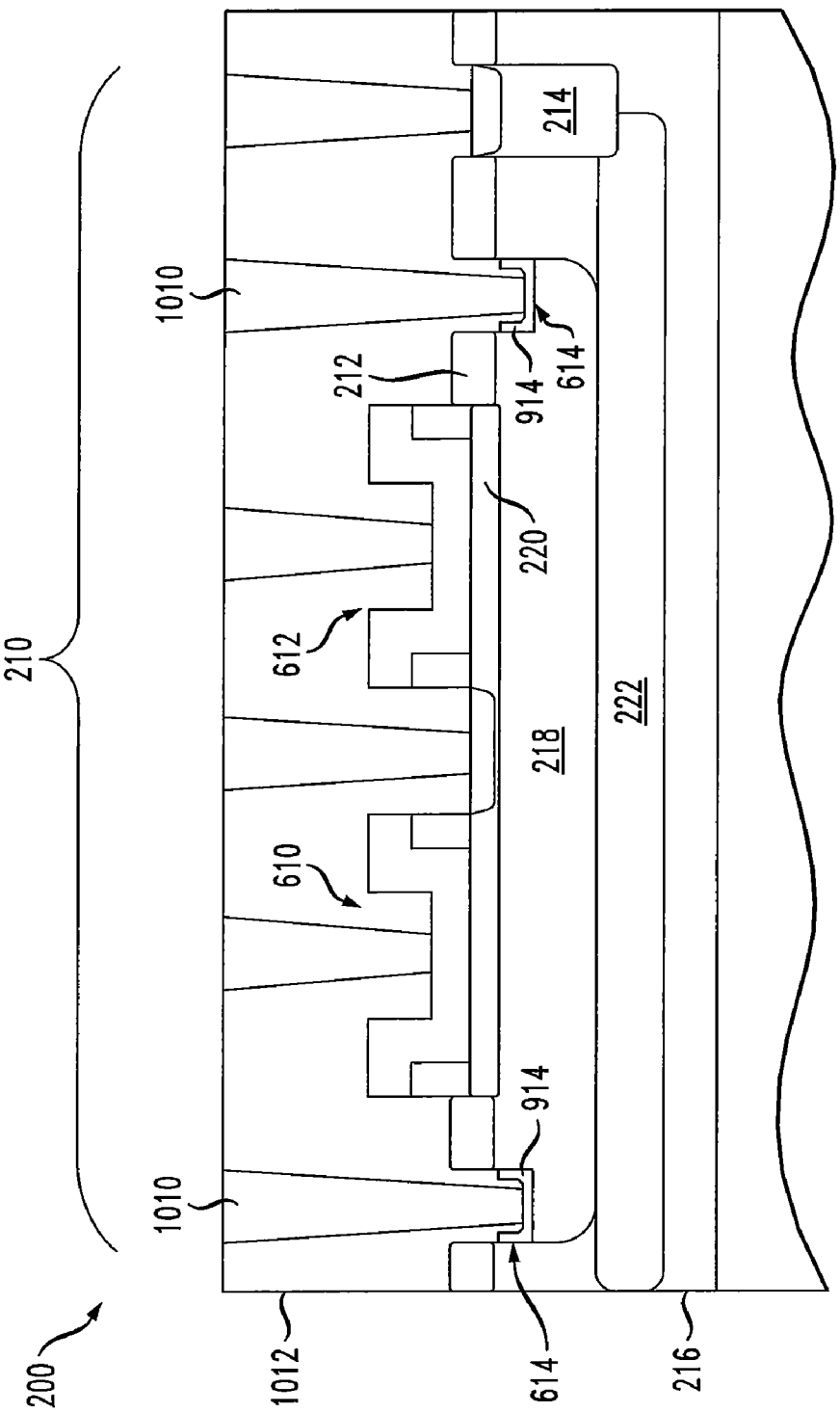

FIG. 10 illustrates the semiconductor device 200 after the formation of contact plugs 1010 through a dielectric layer 1012. Conventional processes may be used to form the contact plugs 1010, which completes the buried contact. While barrier layers are not shown, those who are skilled in the art understand that the barrier layers may also line the contact plugs 1010. The contact plugs 1010 extend well into the collector 218 and contact the junction contacts 914, thereby providing electrical connection to the collector 218. From this point forward, those who are skilled in the art would understand how to complete back-end processing steps to arrive at the integrated circuit device shown in FIG. 1.

Figure 11:
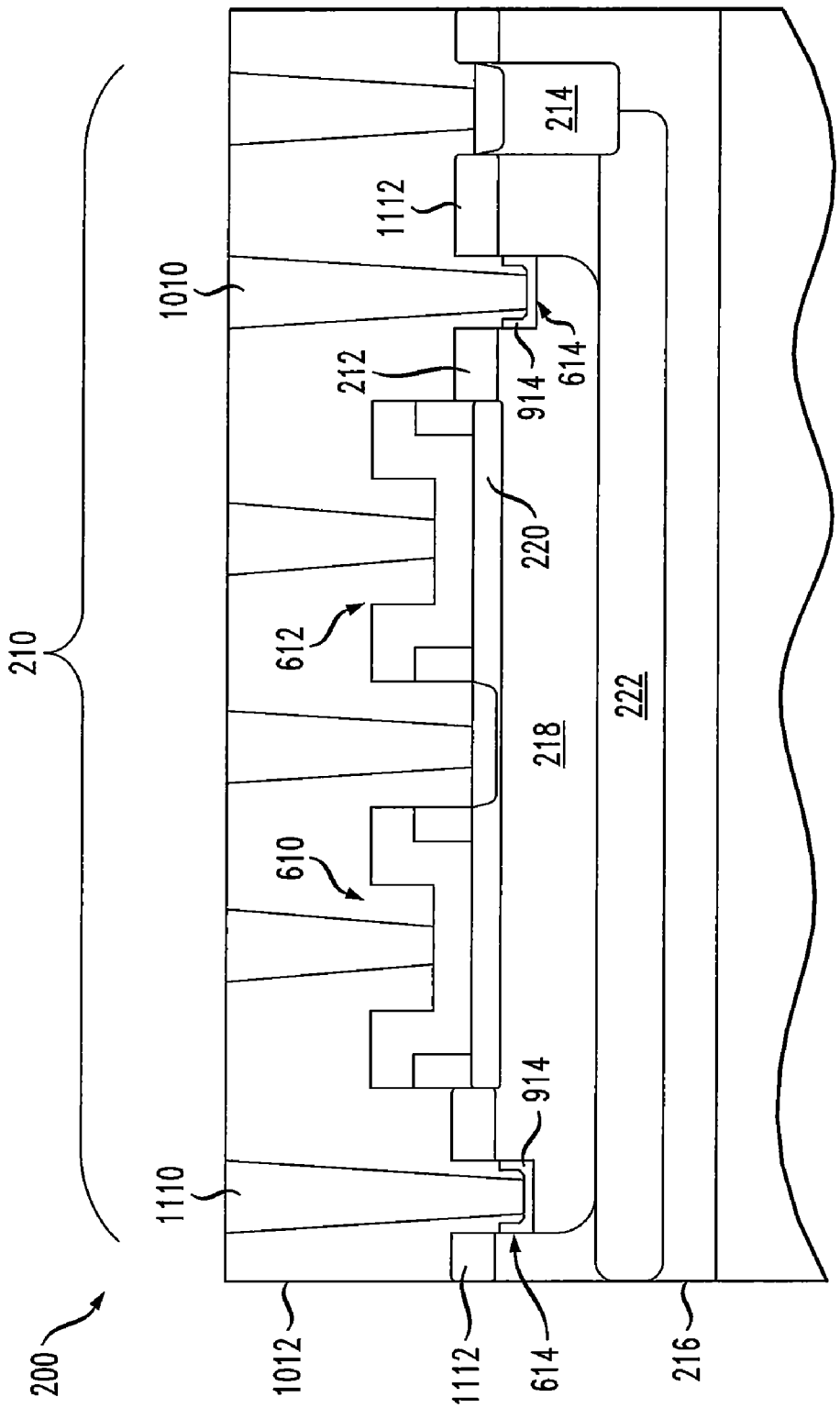
FIG. 11 illustrates an alternative embodiment of a semiconductor device as provided by this disclosure, wherein the buried contact is form through an oxide layer.

FIG. 11 shows an alternative embodiment of the semiconductor device 200, wherein contact plugs 1110 are formed through an oxide layer 1112. In this embodiment, the process steps form the trenches 614 in the collector 218 and through the oxide layer 1112. As seen from the foregoing, the buried contacts may be formed a number of ways to provide a space savings across the wafer, and thereby, provide for greater component densification. Again, from this point forward, those who are skilled in the art would understand how to complete back-end processing steps to arrive at the integrated circuit device shown in FIG. 1.

Although this disclosure has been described in detail, those skilled in the art should understand that they can make various changes, substitutions and alterations herein without departing from the spirit and scope of this disclosure in its broadest form.

What is claimed is:

1. A method of manufacturing a semiconductor device, comprising:
 forming a collector for a bipolar transistor within a semiconductor substrate, wherein the collector excludes a collector tub;
 forming an isolation region under the collector;
 forming a contact trench within the collector;
 forming a diffusion buried contact region within the trench, at least a portion of the diffusion buried contact region located within the trench and extending along sidewalls of the trench, the diffusion buried contact region extending into the collector to a depth sufficient to contact and make electrical connection with the collector
 forming a base within the collector;
 forming at least first and second bipolar transistor emitter structures on a surface of the semiconductor substrate and over the base and the collector and having a common base contact region located in the base and between the at least first and second bipolar transistors; and
 forming a contact plug that extends into the collector to the depth to contact the diffusion buried contact region within the trench.

2. The method recited in claim 1, wherein the diffusion buried contact region is formed subsequent to forming the at least first and second bipolar transistor emitter structures.

3. The method recited in claim 1, wherein forming the diffusion buried contact region includes forming the trench within the collector to a depth of at least about 0.050 microns.

4. The method recited in claim 3, wherein the trench is formed using an etch process that patterns the at least first and second bipolar transistor emitter structures over the collector.

5. The method recited in claim 1, wherein the depth extends to a peak concentration region of the collector.

6. The method recited in claim 5, wherein a depth of the peak concentration ranges from about 4 microns to about 9 microns from an upper surface of the semiconductor substrate.

7. The method recited in claim 1, wherein the at least first and second bipolar transistor emitter structures form a portion of vertical bipolar transistors.

8. The method recited in claim 1, wherein forming the buried contact includes forming an opening in an oxide layer located over the collector, the opening exposing a surface of the semiconductor substrate.

9. The method recited in claim 8, wherein the buried contact is formed through an oxide isolation region located over the collector.

10. The method recited in claim 1, further includes forming a plurality of bases and emitters for a plurality of bipolar transistors, wherein the bipolar transistors form a portion of an integrated circuit and the method further includes:
 forming non-bipolar transistors over the semiconductor substrate;
 forming dielectric layers over the non-bipolar transistors and bipolar transistors; and
 forming interconnects in the dielectric layers that electrically connect the non-bipolar and bipolar transistors, wherein a portion of the interconnects forms a portion of each the buried contact associated with each of the plurality of bipolar transistors.

* * * * *